US012609711B2

(12) United States Patent
Soundararajan et al.

(10) Patent No.: US 12,609,711 B2
(45) Date of Patent: Apr. 21, 2026

(54) ANALOG-TO-DIGITAL CONVERTER WITH AN OVER-RANGE STAGE

(71) Applicant: TEXAS INSTRUMENTS INCORPORATED, Dallas, TX (US)

(72) Inventors: Rishi Soundararajan, Bengaluru (IN); Visvesvaraya Appala Pentakota, Bengaluru (IN); Sai Vikas Kandimalla, Nalgonda (IN); Neeraj Shrivastava, Bengaluru (IN); Eeshan Miglani, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 84 days.

(21) Appl. No.: 18/524,652

(22) Filed: Nov. 30, 2023

(65) Prior Publication Data

US 2025/0023575 A1    Jan. 16, 2025

(30) Foreign Application Priority Data

Jul. 11, 2023    (IN) .............................. 202341046738

(51) Int. Cl.
*H03M 1/10*          (2006.01)
(52) U.S. Cl.
CPC ................................. *H03M 1/1014* (2013.01)
(58) Field of Classification Search
CPC .................................................. H03M 1/1014
See application file for complete search history.

(56) References Cited

U.S. PATENT DOCUMENTS

| | | | | |
|---|---|---|---|---|
| 8,350,738 B2* | 1/2013 | Sanduleanu | ........ | H03M 1/1061 |
| | | | | 341/120 |
| 11,563,442 B2* | 1/2023 | Kozlov | .............. | H03M 1/1057 |
| 2003/0052803 A1* | 3/2003 | Engl | ................... | H03M 1/1023 |
| | | | | 341/120 |
| 2014/0055295 A1* | 2/2014 | Hernes | ................ | H03M 1/1061 |
| | | | | 341/161 |
| 2022/0255553 A1* | 8/2022 | Zhao | ...................... | G04F 10/005 |
| 2023/0018398 A1* | 1/2023 | Whitcombe | ............ | H03M 1/38 |
| 2023/0024282 A1* | 1/2023 | Akhavan | ................. | H03M 1/56 |

* cited by examiner

*Primary Examiner* — Mohamed Barakat
(74) *Attorney, Agent, or Firm* — Xianghui Huang; Frank D. Cimino

(57) ABSTRACT

An analog-to-digital converter (ADC) includes: a time-domain ADC core; and a calibration circuit. The time-domain ADC core includes: a first delay-to-digital stage having a terminal; a second delay-to-digital stage having a terminal; a third delay-to-digital stage having a terminal. The calibration circuitry is coupled to the terminal of the first delay-to-digital stage, the terminal of the second delay-to-digital stage, and the terminal of the third delay-to-digital stage of stages. The calibration circuitry is configured to calibrate the first delay-to-digital stage, the second delay-to-digital stage, and the third delay-to-digital stage based on a zero-crossing calibration and an over-range calibration. The over-range calibration sets a maximum threshold and a minimum threshold for the time-domain ADC relative to a reference voltage.

21 Claims, 9 Drawing Sheets

ANALOG-TO-DIGITAL CONVERTER WITH AN OVER-RANGE STAGE

CROSS REFERENCE TO RELATED APPLICATION

The present application claims priority to India Provisional Application No. 202341046738, titled "IMPROVING THE PERFORMANCE OF TIME DOMAIN ADCs", filed on Jul. 11, 2023, which is hereby incorporated by reference in its entirety.

BACKGROUND

Analog-to-digital converter (ADC) topologies vary with regard to speed, size (cost), and power consumption. Existing time-domain (TD) ADCs have a limitation on inherent signal-to-quantization-noise ratio SQNR because of nonlinear spacing of the voltage thresholds. Also, the gain of TD ADC stages is non-linear. The gain is high when input is close to zero and approaches unity for large inputs. Existing gain limitations limit the accuracy of multiple stages in series.

SUMMARY

In an example, an analog-to-digital converter (ADC) includes: a time-domain ADC core; and calibration circuitry. The time-domain ADC core includes: a first delay-to-digital stage having a terminal; a second delay-to-digital stage having a terminal; a third delay-to-digital stage having a terminal. The calibration circuitry is coupled to the terminal of the first delay-to-digital stage, the terminal of the second delay-to-digital stage, and the terminal of the third delay-to-digital stage of stages. The calibration circuitry is configured to calibrate the first delay-to-digital stage, the second delay-to-digital stage, and the third delay-to-digital stage based on a zero-crossing calibration and an over-range calibration. The over-range calibration sets a maximum threshold and a minimum threshold for the time-domain ADC relative to a reference voltage.

In another example, a circuit includes a time-domain ADC including delay-to-digital stages; and calibration circuitry coupled to each delay-to-digital stage of the delay-to-digital stages. The calibration circuitry is configured to calibrate the delay-to-digital stages based on a zero-crossing calibration and an over-range calibration, the over-range calibration setting a maximum threshold and a minimum threshold for the time-domain ADC relative to a reference voltage.

In yet another example, a time-domain ADC method includes: calibrating a first delay-to-digital stage as a zero-crossing stage with a zero-crossing threshold based on the calibration input signal; calibrating a second delay-to-digital stage as an over-range stage, the over-range stage setting a maximum threshold and a minimum threshold for the time-domain ADC relative to a reference voltage; calibrating each delay-to-digital stage of additional delay-to-digital stages based on the zero-crossing stage threshold, the maximum threshold, and the minimum threshold; receiving an analog input signal; and digitizing the analog input signal based on the calibrated zero-crossing stage, the calibrated over-range stage, and calibrated additional delay-to-digital stages.

DETAILED DESCRIPTION

Figure 1:
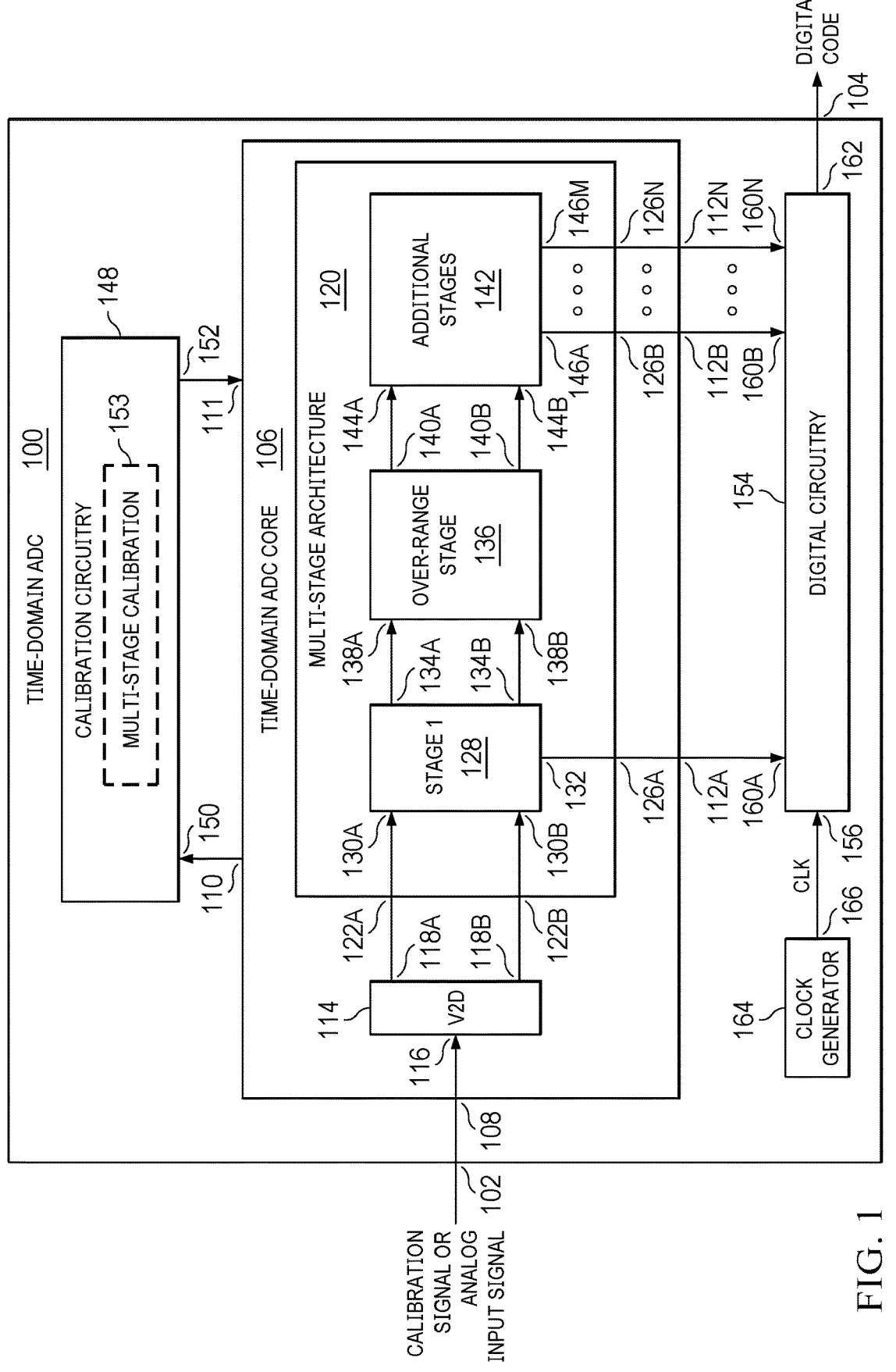
FIG. 1 is a block diagram showing an example time-domain (TD) analog-to-digital converter (ADC).

The same reference numbers or other reference designators are used in the drawings to designate the same or similar features. Such features may be the same or similar either by function and/or structure.

Described herein is a time-domain (TD) analog-to-digital converter (ADC) having a multi-stage architecture and calibration circuitry. The multi-stage architecture includes a first stage, a second stage, and additional stages. Each of the first stage, a second stage, and additional stages may be delay-to-digital stages. The calibration circuitry is configured to: calibrate outputs of the first stage based on a zero-crossing calibration; calibrate outputs of the second stage based on an over-range calibration; and calibrate outputs of each stage of the additional stages based on the zero-crossing calibration and the over-range calibration. With the multi-stage architecture and the operations of the calibration circuitry, the signal-to-quantization-noise ratio (SQNR) and gain of the described TD ADCs are improved relative to previous TD ADCs that do not use an over-range calibration. With an improved SQNR (e.g., greater than 45 dB), the described TD ADCs can support an 8-bit output, a 10-bit output, or other multi-bit output. Also, with an improved gain profile, the size of later stages of the described TD ADCs can be reduced (reducing the cost of an ADC or related circuit). Compared to other ADC topologies, the described TD ADCs support target speeds (e.g., an 8 GHz ADC, a 32 GHz ADC, a 1.5 GHz high signal-to-noise ratio (SNR) ADC, a 2 GHz high-SNR ADC, a 3 GHz high-SNR ADC, a radar chip, or other ADC products). As used herein, "high-SNR" refers to an SNR greater than 70 db.

FIG. 1 is a block diagram showing an example TD ADC 100. The TD ADC 100 has a first terminal 102 and a second terminal 104. The TD ADC 100 includes a TD ADC core 106, calibration circuitry 148, digital circuitry 154, and a clock generator 164. The TD ADC core 106 has a first terminal 108, a second terminal 110, a third terminal 111, and a set of fourth terminals 112A to 112N. In some examples, the TD ADC core 106 includes voltage-to-delay (V2D) circuitry 114 and a multi-stage architecture 120. The V2D circuitry 114 has a first terminal 116, a second terminal 118A, and a third terminal 118B. The multi-stage architecture 120 has a first terminal 122A, the second terminal 122B, and a set of third terminals 126A to 126N. The multi-stage architecture 120 includes a first stage 128, an over-range stage 136, and additional stages 142. The first stage 128 has a first terminal 130A, a second terminal 130B, a third terminal 132, a fourth terminal 134A, and a fifth terminal 134B. The over-range stage 136 has a first terminal 138A, a second terminal 138B, a third terminal 140A, and a fourth terminal 140B. The additional stages have a first terminal 144A, a second terminal 144B, and a set of third terminals 146A to 146M. The calibration circuitry 146 has a first terminal 150 and a second terminal 152. The digital circuitry 154 has a first terminal 156, a set of second terminals 160A to 160N, and a third terminal 162. The clock generator 164 has a terminal 166.

The first terminal 102 of the TD ADC 100 is coupled to the first terminal 108 of the TD ADC core 106. The second terminal 110 of the TD ADC core 106 is coupled to the first terminal of the calibration circuitry 148. The third terminal 111 of the TD ADC core 106 is coupled to the second terminal 152 of the calibration circuitry 148. The terminals of the set of fourth terminals 112A to 112N of the TD ADC core 106 are coupled to respective terminals of the set of second terminals 160A to 160N of the digital circuitry 154. The first terminal 156 of the digital circuitry 154 is coupled to the terminal 166 of the clock generator 164. The third terminal 162 of the digital circuitry 154 is coupled to the second terminal 104 of the TD ADC 100.

The first terminal 116 of the V2D circuitry 114 is coupled to the first terminal 108 of the TD ADC core 106. The second terminal 118A of the V2D circuitry 114 is coupled to the first terminal 122A of the multi-stage architecture 120. The third terminal 118B of the V2D circuitry 114 is coupled to the second terminal 122B of the multi-stage architecture 120. The terminals of the set of third terminals 126A to 126N of the multi-stage architecture 120 are coupled to the respective terminals of the set of fourth terminals 112A to 112N of the TD ADC core 106.

The first terminal 130A of the first stage 128 is coupled to the first terminal 122A of the multi-stage architecture 120. The second terminal 130B of the first stage 128 is coupled to the second terminal 122B of the multi-stage architecture 120. The third terminal 132 of the first stage 128 is coupled to a respective terminal 126A of the set of third terminals 126A to 126N of the multi-stage architecture 120. The fourth terminal 134A of the first stage 128 is coupled to the first terminal 138A of the over-range stage 136. The fifth terminal 134B of the first stage 128 is coupled to the second terminal 138B of the over-range stage 136. The third terminal 140A of the over-range stage 136 is coupled to the first terminal 144A of the additional stages 142. The fourth terminal 140B of the over-range stage 136 is coupled to the second terminal 144B of the additional stages 142. The terminals of the set of third terminals 146A to 146M of the additional stages 142 are coupled to respective terminals of the set of third terminals 126A to 126N of the multi-stage architecture 120.

In some examples, the clock generator 164 includes delay circuitry to generate various clock phases from a single clock. The different clock phases are used to reset each stage of the multi-stage architecture 120 and latch the output of each stage of the multi-stage architecture 120.

In some examples, the V2D circuitry 114 includes an array of preamplifiers or a single preamplifier followed by a digital gate. The array of preamplifiers or the single pream- plifier may have discharge current based on the input signal, and the digital gate forwards the discharge current value at intervals based on a clock signal. In other examples, the V2D circuitry 114 may include a capacitor, a sampling circuit, and a digital gate. In such examples, the sampled charge on the capacitor may be discharged with a constant current. The digital gate forwards the sampled charge value at intervals based on a clock signal.

During calibration, the TD ADC 100 operates to: receive a calibration signal at the first terminal 102; and perform calibration for each stage of the multi-stage architecture 120 responsive to the calibration signal, operations of each stage of the multi-stage architecture 120, and operations of the calibration circuitry 148. In some examples, the calibration is performed during one start-up or each start-up of the TD ADC 100 and/or periodically responsive to a schedule or other calibration trigger. For example, each stage of the multi-stage architecture 120 may include circuitry to adjust the delay for each output (e.g., OUTP and OUTM herein). As an example, variable capacitors (e.g., the variable capaci- tors VC1 and VC2 in FIG. 3) may be used to adjust the delay for each output of each respective stage of the multi-stage architecture 120 responsive to calibration adjustments (e.g., CAL_CS1 and CAL_CS2 in FIG. 3) from the calibration circuitry 148.

In some examples, the TD ADC core 106 operates to: receive the calibration signal at the first terminal 108; provide outputs for each stage of the multi-stage architecture 120 at the second terminal 110 responsive to the calibration signal and respective operations of each stage of the multi- stage architecture 120; receive calibration updates at the third terminal 111 responsive to the outputs provided to the second terminal 110 and the operations of the calibration circuitry 148; and update delay settings for each stage of the multi-stage architecture 120 responsive to respective cali- bration updates.

In some examples, the calibration circuitry 148 operates to: receive outputs from each stage of the multi-stage architecture 120; and determine calibration adjustments based on the received outputs and the operations of multi- stage calibration circuitry 153 of the calibration circuitry 148. In some examples, the calibration circuitry 148 includes a linear digital-to-analog converter (DAC) and a digital block. The linear DAC provides a known calibration input signal. The digital block observes outputs of each stage responsive to the known calibration input signal and pro- vides analog delay correction. In some examples, the digital block may build a look-up table (LUT) of analog delay corrections for each stage and select analog delay correc- tions in the LUT responsive to the known calibration input signal and the resulting outputs of each stage.

In some examples, the multi-stage calibration circuitry 153 determines calibration adjustments for the stages of the multi-stage architecture 120. Example calibrations per- formed by the multi-stage calibration circuitry 153 include a zero-crossing stage calibration, the over-range stage cali- bration, and additional stage calibrations.

After calibration, the TD ADC 100 operates to: receive an analog input signal at the first terminal 102; and provide a digital code at the second terminal 104 responsive to the analog input signal, the operations of the TD ADC core 106, the digital circuitry 154, and the clock generator 164. More specifically, the TD ADC core 106 operates to: receive the analog input signal at the first terminal 108; and provide outputs for each stage of the multi-stage architecture 120 at respective terminals of the set of fourth terminals 112A to 112N of the TD ADC core 106 responsive to the analog input signal, respective operations of each stage of the multi-stage architecture 120, and a previous calibration for each stage of the multi-stage architecture 120.

The digital circuitry 154 operates to: received a clock signal (CLK) at the first terminal 156; receive the outputs from each stage of the multi-stage architecture 120 at the set of second terminals 160A to 160N; generate a digital code based on the outputs and at a rate determined by CLK; and provide the digital code to the third terminal 162. In some examples, the digital circuitry 154 receives the sign bit from each stage of the multi-stage architecture 120 (e.g., a grey code pattern) and converts the sign bits to a binary output.

In some examples, the digital circuitry 154 aligns the sign bits from all stages of the multi-stage architecture 120 before converting the sign bits to the binary output.

Figure 2:
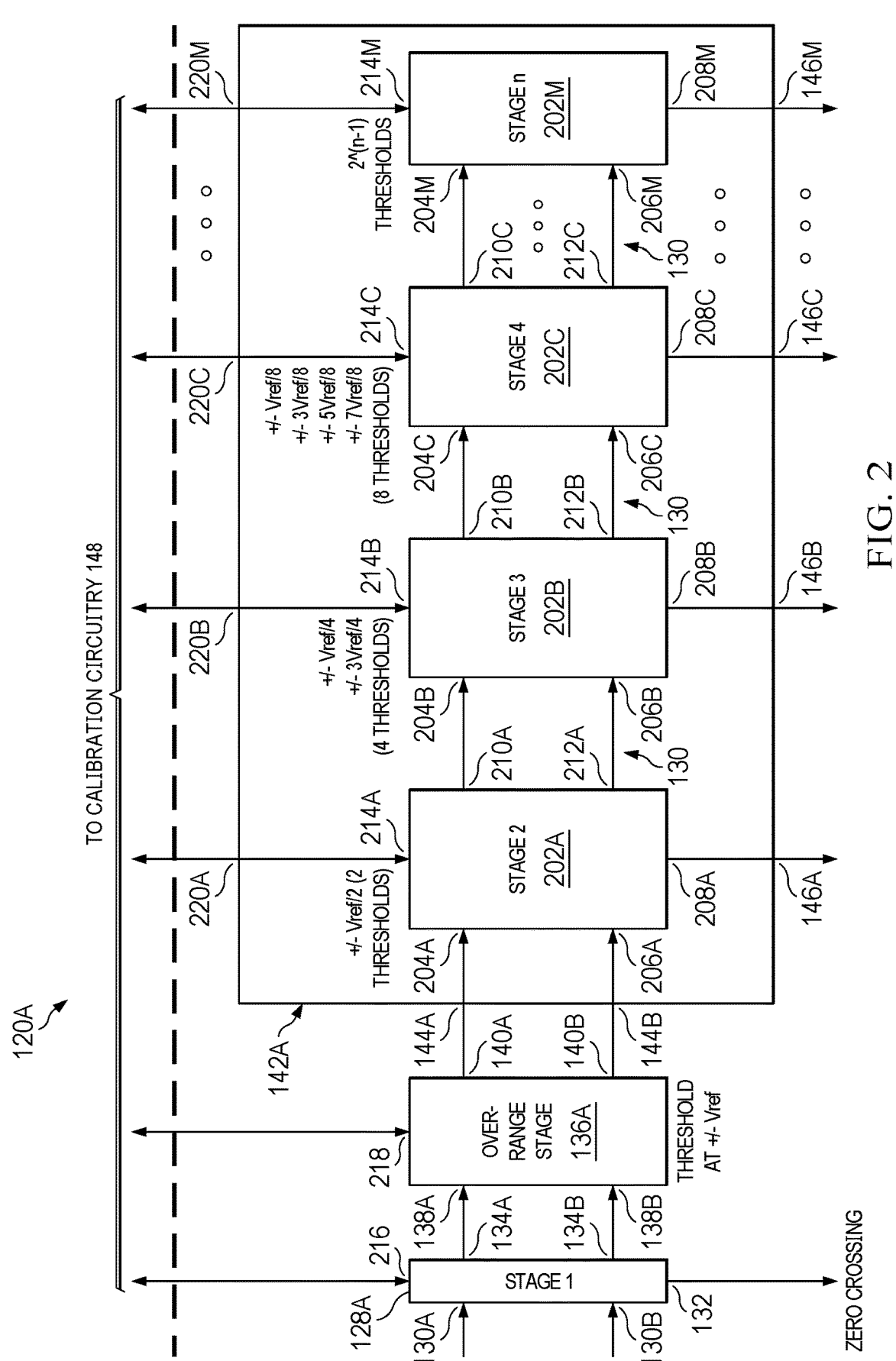
FIG. 2 is a block diagram showing an example multi-stage architecture of the TD ADC of FIG. 1.

FIG. 2 is a block diagram showing an example multi-stage architecture 120A of the TD ADC of FIG. 1. The multi-stage architecture 120A of FIG. 2 is an example of the multi-stage architecture 120 of FIG. 1. As shown, the multi-stage architecture 120A includes a first stage 128A, an over-range stage 136A, and additional stages 142A. The first stage 128A of FIG. 2 is an example of the first stage 128 of FIG. 1. The over-range stage 136A of FIG. 2 is an example of the over-range stage 136 of FIG. 1. The additional stages 142A of FIG. 2 is an example of the additional stages 142 of FIG. 1.

In the example of FIG. 2, the first stage 128A has the first terminal 130A, the second terminal 130B, the third terminal 132, the fourth terminal 134A, and the fifth terminal 134B described in FIG. 1. The first stage 128A also has a sixth terminal 216. The over-range stage 136A has the first terminal 138A, the second terminal 138B, the third terminal 140A, and the fourth terminal 140B described in FIG. 1. The over-range stage 136A also has a fifth terminal 218. The additional stages 142A have the first terminal 144A, the second terminal 144B, and the set of third terminals 146A to 146M described in FIG. 1. The additional stages 142A also have a set of fourth terminals 220A to 220M, which provide an interface to calibration circuitry such as the calibration circuitry 148 in FIG. 1.

As shown, the additional stages 142A include a second stage 202A, a third stage 202B, a fourth stage 202C, up to an Mth stage 202M. Each of the stages 202A to 202M includes a respective first terminal 204A to 204M, a respective second terminal 206A to 206M, and a respective third terminal 208A to 208M. Each of the stages 202A to 202L includes a respective fourth terminal 210A to 210L and a respective fifth terminal 212A to 212L. In the example of FIG. 2, the third terminals 208A to 208M of the stages 202A to 202M are coupled to respective terminals of the set of third terminals 146A to 146M of the additional stages 142A.

In the example of FIG. 2, the fourth terminal 134A of the first stage 128 is coupled to the first terminal 138A of the over-range stage 136. The fifth terminal 134B of the first stage 128 is coupled to the second terminal 138B of the over-range stage 136. The third terminal 140A of the over-range stage 136 is coupled to the first terminal 204A of the second stage 202A. The fourth terminal 140B of the over-range stage 136 is coupled to the second terminal 206A of the second stage 202A. The fourth terminal 210A of the second stage 202A is coupled to the first terminal 204B of the third stage 202B. The fifth terminal 212A of the second stage 202A is coupled to the second terminal 206B of the third stage 202B. The fourth terminal 210B of the third stage 202B is coupled to the first terminal 204C of the fourth stage 202C. The fifth terminal 212B of the third stage 202B is coupled to the second terminal 206C of the fourth stage 202C. The fourth terminal 210C of the fourth stage 202C is coupled to a first terminal 204D of a fifth stage 202D, and so on up to the stage 202M. The fifth terminal 212C of the fourth stage 202C is coupled to a second terminal 206D of a fifth stage 202D, and so on up to the stage 202M.

In the example of FIG. 2, the sixth terminal 216 of the first stage 128A, the fifth terminal 218 of the over-range stage 136A, and the respective sixth terminals 214A to 214N of the stage 202A to 202M may be coupled to calibration circuitry such as the calibration circuitry 148 of FIG. 1. The third terminal 132 of the first stage 128A, the third terminal 208A of the second stage 202A, the third terminal 208B of the third stage 202B, the third terminal 208C of the fourth stage 202C, up to the third terminal 208M of the stage 202M may be coupled to digital circuitry such as the digital circuitry 154 of FIG. 1.

Figure 3:
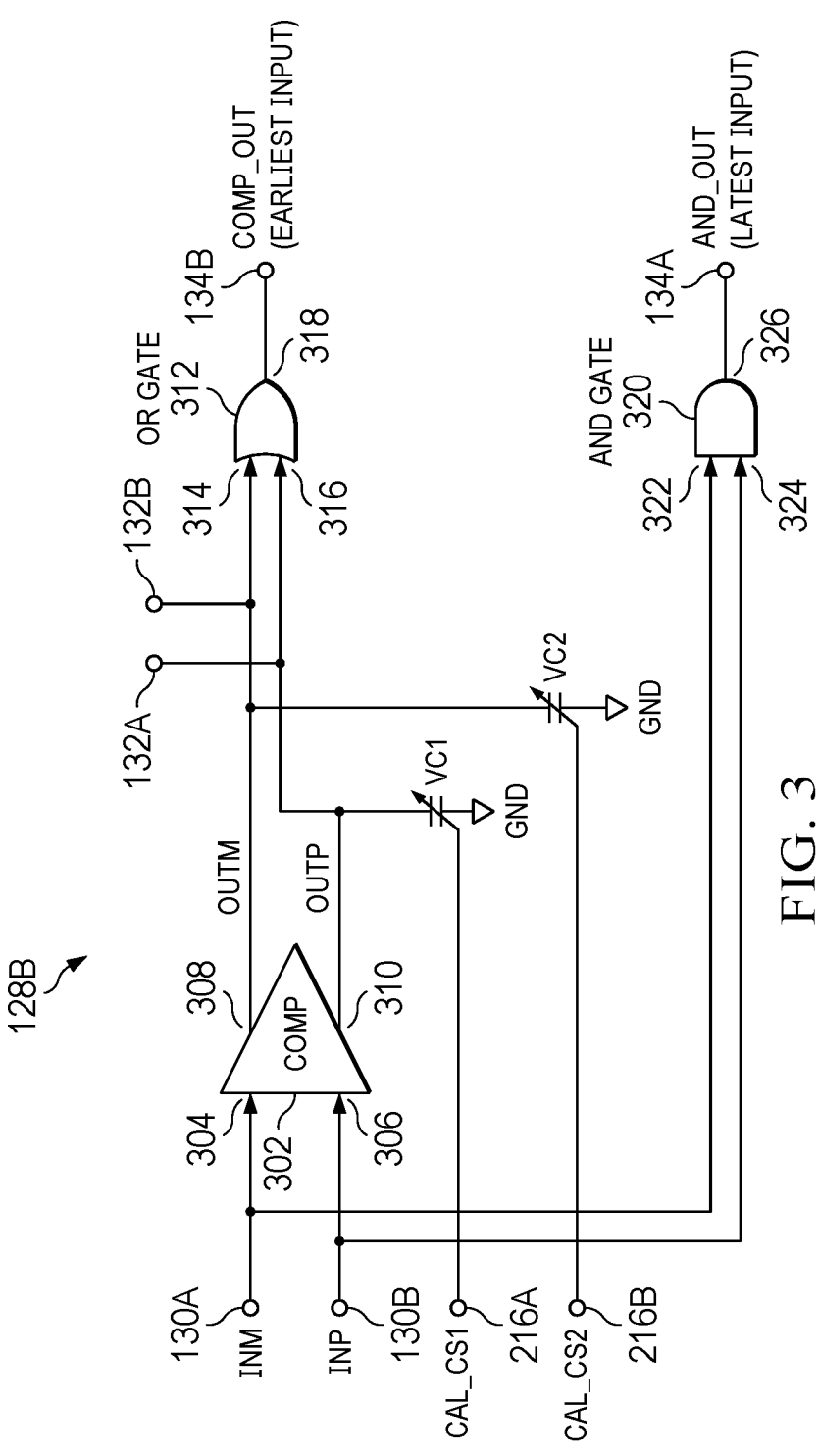
FIG. 3 is a diagram showing an example first stage of the multi-stage architectures of FIGS. 1 and 2.

In some examples, the first stage 128A, the over-range stage 136A, and each stage of the additional stages 142A may have the components and topology described for the stage 128B in FIG. 3. The first stage 128A is calibrated to be a zero-crossing stage having a threshold at 0. The over-range stage 136A is calibrated to be an over-range stage having two thresholds at +/−a reference voltage (Vref). The second stage 202A is calibrated to be a stage having two thresholds $$\text{at } +/-\frac{Vref}{2}.$$

The third stage 202B is calibrated to be a stage having four thresholds $$\text{at } +/-\frac{Vref}{4}$$

and $$+/-3\times\frac{Vref}{4}.$$

The fourth stage 202B is calibrated to be a stage having eight thresholds $$\text{at } +/-\frac{Vref}{8},$$

$$+/-3\times\frac{Vref}{8},$$

$$+/-5\times\frac{Vref}{8},$$

and $$+/-7\times\frac{Vref}{8}.$$

The stage 202M is calibrated to be a stage having $2^{(n-1)}$ thresholds. The calibrations of the second stage 202A to the stage 202M are based on the zero-crossing calibration and the over-range calibration, which improves accuracy of the related thresholds.

FIG. 3 is a diagram showing an example first stage 128B of the multi-stage architecture 120 and 120A of FIGS. 1 and 2. The first stage 128B is an example of the first stage 128 in FIG. 1, or the first stage 128A in FIG. 2. The over-range stage (e.g., the over-range stage 136 in FIG. 1, or the over-range stage 136A in FIG. 2), and each stage of the additional stages (e.g., the additional stages 142 in FIG. 1, or the additional stages 142A in FIG. 2) may have the same components and architecture as the first stage 128B described in FIG. 3.

As shown, the first stage 128B has the first terminal 130A, the second terminal 130B, third terminals 132A and 132B, the fourth terminal 134A, the fifth terminal 134B, and sixth terminals 216A and 216B. The third terminals 132A and 132B are examples of the third terminal 132 in FIG. 2. The sixth terminals 216A and 216B are examples of the sixth terminal 216 in FIG. 2. The first stage 128B includes a comparator 302, variable capacitors VC1 and VC2, an OR gate 312, and an AND gate 320 in the arrangement shown.

The comparator 302 has a first terminal 304, a second terminal 306, a third terminal 308, and a fourth terminal 310. Each of the variable capacitors VC1 and VC2 has a first terminal and a second terminal. The OR gate 312 has a first terminal 314, a second terminal 316, and a third terminal 318. The AND date 320 has a first terminal 322, a second terminal 324, and a third terminal 326.

In the example of FIG. 3, the first terminal 130A of the first stage 128B is coupled to the first terminal 304 of the comparator 302 and to the first terminal 322 of the AND gate 320. The second terminal 130B of the first stage 128B is coupled to the second terminal 306 of the comparator 302 and to the second terminal 324 of the AND gate 320. The third terminal 326 of the AND gate 320 is coupled to the fourth terminal 134A of the first stage 128B. The third terminal 308 of the comparator 302 is coupled to the first terminal 314 of the OR gate 312, to the third terminal 132B of the first stage 128B, and to the first terminal of the variable capacitor VC2. The second terminal of the variable capacitor VC2 is coupled to ground or a ground terminal. The fourth terminal 310 of the comparator 302 is coupled to the second terminal 316 of the OR gate 312, to the third terminal 132A of the first stage 128B, and to the first terminal of the variable capacitor VC1. The second terminal of the variable capacitor VC1 is coupled to ground or a ground terminal. The third terminal 318 of the OR gate 312 is coupled to the fifth terminal 134B of the first stage 128B.

In the example of FIG. 3, comparator 302 operates to: receive a first pulse (INM) at the first terminal 304 of the comparator 302; receive a second pulse (INP) at the second terminal 306 of the comparator 302; provide a first output (OUTM) at the third terminal 308 of the comparator 302 responsive to INM and INP; and provide a second output (OUTP) at the fourth terminal 310 of the comparator 302 responsive to INM and INP. The OR gate 312 operates to: receive OUTM at the first terminal 314 of the OR gate 312; receive OUTP at the second terminal 316 of the OR gate 312; and provide an OR result (COMP_OUT) at the third terminal 318 of the OR gate 312 responsive to OUTM and OUTP. COMP_OUT indicates which of INM and INP is the earliest (first) pulse to arrive to the comparator 302. The AND gate 320 operates to: receive OUTM at the first terminal 322 of the AND gate 320; receive OUTP at the second terminal 324 of the AND gate 320; and provide an AND result (AND_OUT) at the third terminal 326 of the AND gate 320 responsive to OUTM and OUTP. AND_OUT indicates which of INM and INP is the latest (last) pulse to arrive to the comparator 302.

During calibration, OUTP is provided to the third terminal 132A, and OUTM is provided to the third terminal 132B. Calibration circuitry (e.g., the calibration circuitry 148 in FIG. 1) uses OUTP and OUTM to determine calibrations adjustments CAL_CS1 and CAL_CS2. The first variable capacitor VC1 operates to: receive CAL_CS1 from the sixth terminal 216A; and adjust a delay of OUTP responsive to CAL_CS1. The second variable capacitor VC2 operates to: receive CAL_CS2 from the sixth terminal 216B; and adjust a delay of OUTM responsive to CAL_CS2. After calibration, the first stage 128B may be a zero-crossing stage having one threshold at zero.

For an over-range stage, the first variable capacitor VC1 may operate to: receive CAL_CS1 from a sixth terminal similar to the sixth terminal 216A; and adjust a delay of OUTP responsive to CAL_CS1, where CAL_CS1 sets a positive reference voltage value (+Vref). For an over-range stage, the second variable capacitor VC2 may operate to: receive CAL_CS2 from a sixth terminal similar to the sixth terminal 216B; and adjust a delay of OUTP responsive to CAL_CS2, where CAL_CS2 sets a negative reference voltage value (–Vref).

For a second stage (e.g., the second stage 202A in FIG. 2), a first variable capacitor VC1 may operate to: receive CAL_CS1 from a sixth terminal similar to the sixth terminal 216A; and adjust a delay of OUTP responsive to CAL_CS1, where CAL_CS1 sets a threshold $$at + \frac{Vref}{2}.$$

For a second stage, a second variable capacitor VC2 may operate to: receive CAL_CS2 from a sixth terminal similar to the sixth terminal 216B; and adjust a delay of OUTM responsive to CAL_CS2, where CAL_CS2 sets a threshold at $$at - \frac{Vref}{2}.$$

For a third stage (e.g., the third stage 202B in FIG. 2), a first variable capacitor VC1 may operate to: receive CAL_CS1 from a sixth terminal similar to the sixth terminal 216A; and adjust a delay of OUTP responsive to CAL_CS1, where CAL_CS1 sets thresholds $$at + \frac{Vref}{4}$$

and $$+3 \times \frac{Vref}{4}.$$

For a third stage, a second variable capacitor VC2 may operate to: receive CAL_CS2 from a sixth terminal similar to the sixth terminal 216B; and adjust a delay of OUTM responsive to CAL_CS2, where CAL_CS2 sets a threshold $$at - \frac{Vref}{4}$$

and $$-3 \times \frac{Vref}{4}.$$

For a fourth stage (e.g., the fourth stage 202C in FIG. 2), a first variable capacitor VC1 may operate to: receive CAL_CS1 from a sixth terminal similar to the sixth terminal 216A; and adjust a delay of OUTP responsive to CAL_CS1, where CAL_CS1 sets thresholds $$at + \frac{Vref}{8},$$

$$+3 \times \frac{Vref}{8},$$

$$+5 \times \frac{Vref}{8},$$

-continued and $$+7 \times \frac{Vref}{8}.$$

For a fourth stage, a second variable capacitor VC2 may operate to: receive CAL_CS2 from a sixth terminal similar to the sixth terminal 216B; and adjust a delay of OUTM responsive to CAL_CS2, where CAL_CS2 sets a threshold $$at{-}\frac{Vref}{8},$$

$$-3 \times \frac{Vref}{8},$$

$$-5 \times \frac{Vref}{8},$$

and $$-7 \times \frac{Vref}{8}.$$

For an Mth stage (e.g., the stage 202M in FIG. 2), a first variable capacitor VC1 may operate to: receive CAL_CS1 from a sixth terminal similar to the sixth terminal 216A; and adjust a delay of OUTP responsive to CAL_CS1, where CAL_CS1 sets the positive thresholds of $2^{(n-1)}$ thresholds for the Mth stage. For an Mth stage, a second variable capacitor VC2 may operate to: receive CAL_CS2 from a sixth terminal similar to the sixth terminal 216B; and adjust a delay of OUTM responsive to CAL_CS2, where CAL_CS2 sets negative thresholds of $2^{(n-1)}$ thresholds for the Mth stage. In the described examples, the zero-crossing calibration and the over-range calibration help establish a symmetric spacing between thresholds of later stages.

Figure 4:
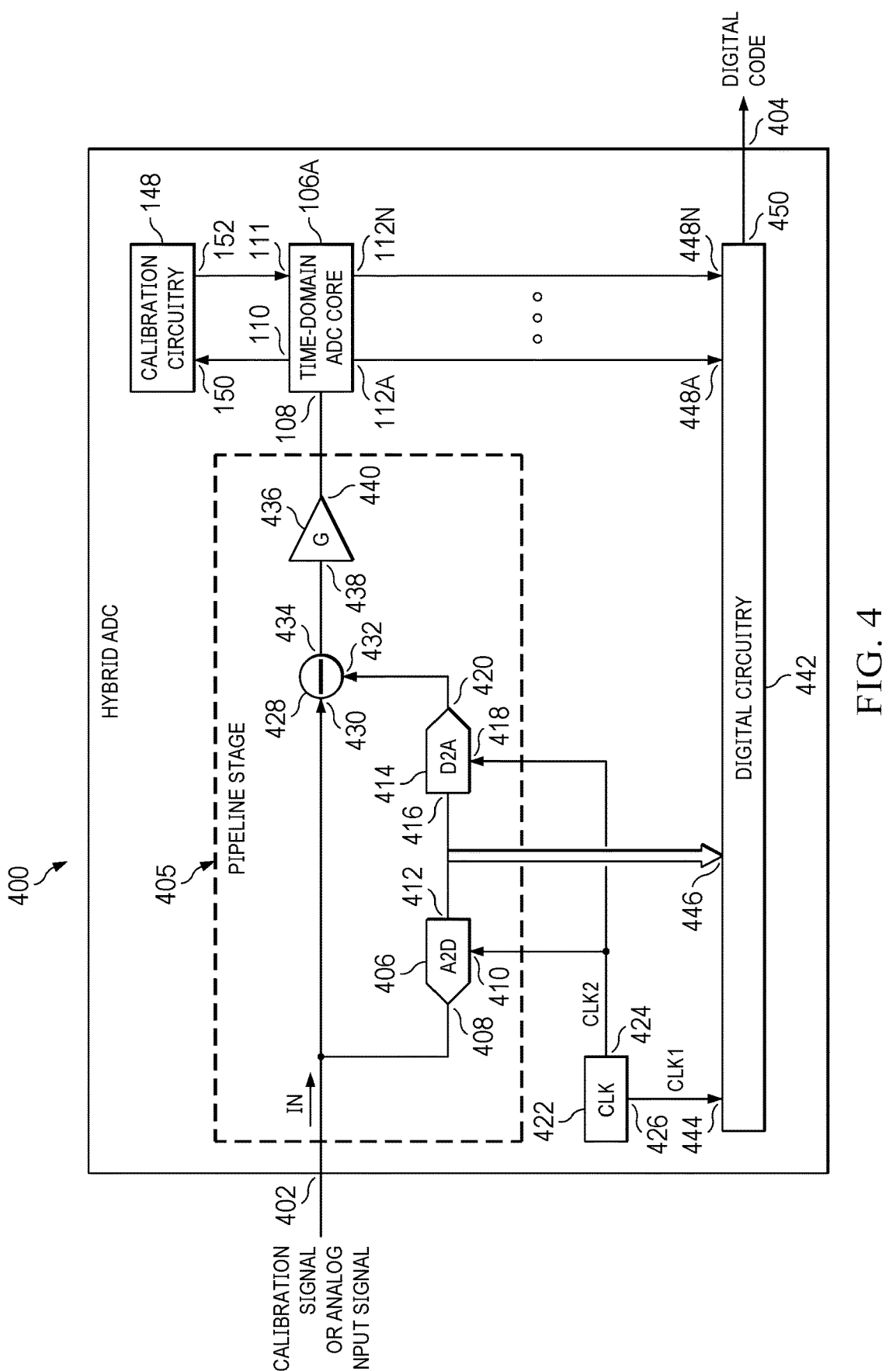
FIG. 4 is a diagram showing an example hybrid ADC with a pipeline stage and a TD ADC core.

FIG. 4 is a diagram showing an example hybrid ADC 400 with a pipeline stage 405 and a TD ADC core 106A. The TD ADC core 106A in FIG. 4 is an example of the TD ADC core 106 in FIG. 1. As shown, the hybrid ADC 400 has a first terminal 402 and a second terminal 404. The hybrid ADC 400 includes the pipeline stage 405, the TD ADC core 106A, the calibration circuitry 148, a clock generator 422, and digital circuitry 442.

In the example of FIG. 4, TD ADC core 106A has the first terminal 108, the second terminal 110, the third terminal 111, and the set of fourth terminals 112A to 112N. The calibration circuitry 148 has the first terminal 150 and the second terminal 152 described in FIG. 1. The pipeline stage 405 includes an analog-to-digital (A2D) circuit 406, a digital-to-analog (D2A) circuit 414, a subtract circuit 428, and a buffer 436. The A2D circuit 406 has a first terminal 408, a second terminal 410, and a third terminal 412. The D2A circuit 414 has a first terminal 416, a second terminal 418, and a third terminal 420. The subtract circuit 428 has a first terminal 430, a second terminal 432, and a third terminal 434. The buffer 436 has a first terminal 438 and a second terminal 440. The clock generator 422 has a first terminal 424 and a second terminal 426. The digital circuitry 442 has a first terminal 444, a second terminal 446, a set of third terminals 448A to 448N, and a fourth terminal 450.

As shown, the first terminal 408 of the A2D circuit 406 is coupled to the first terminal 402 of the hybrid ADC 400. The second terminal 410 of the A2D circuit 406 is coupled to the first terminal 424 of the clock generator 422. The third terminal 412 of the A2D circuit 406 is coupled to the first terminal 416 of the D2A circuit 414 and to the second terminal 446 of the digital circuitry 442. The second terminal 418 of the D2A circuit 414 is coupled to the first terminal 424 of the clock generator 422. The third terminal 420 of the D2A circuit 414 is coupled to the second terminal 432 of the subtract circuit 428. The first terminal 430 of the subtract circuit 428 is coupled to the first terminal 402 of the hybrid ADC 400. The third terminal 434 of the subtract circuit 428 is coupled to the first terminal 438 of the buffer 436. The second terminal 440 of the buffer 436 is coupled to the first terminal 108 of the TD ADC core 106A. The first terminal 444 of the digital circuitry 442 is coupled to the second terminal 426 of the clock generator 422. The set of third terminals 448A to 448N of the digital circuitry 442 is coupled to respective terminals of the set of fourth terminal 112A to 112N of the TD ADC core 106A. The fourth terminal 450 of the digital circuitry 442 is coupled to the second terminal 404 of the hybrid ADC 400.

During calibration, the hybrid ADC 400 operates to: receive a calibration signal at the first terminal 402; and perform calibration for each stage of the TD ADC core 106A responsive to the calibration signal, operations of each stage of the TD ADC core 106A, and operations of the calibration circuitry 148. In some examples, the calibration is performed during one start-up or each start-up of the hybrid ADC 400 and/or periodically responsive to a schedule or other calibration trigger. For example, each stage of the TD ADC core 106A may include circuitry to adjust the delay for each output (e.g., OUTP and OUTM herein). As an example, variable capacitors (e.g., the variable capacitors VC1 and VC2 in FIG. 3) may be used to adjust the delay for each output of each respective stage of the TD ADC core 106A responsive to calibration adjustments (e.g., CAL_CS1 and CAL_CS2 in FIG. 3) from the calibration circuitry 148.

In some examples, the pipeline stage 405 operates to: receive a calibration signal from the first terminal 402 of the hybrid ADC 400; receive a clock signal (CLK2) from the clock generator 422; convert the calibration signal to a digital result based on CLK2 and the operations of the A2D circuit 406; convert the digital result back to an analog result based on CLK2 and operations of the D2A circuit 414; subtract the analog result from the analog input signal using the subtract circuit 428 to obtain a subtraction result; and apply a gain (G) to the subtraction result using the buffer 436, resulting in a pipeline stage output. The TD ADC core 106A operates to: receive the pipeline stage output at the first terminal 108; provide outputs for each stage of the TD ADC core 106A at the second terminal 110 responsive to the pipeline stage output and respective operations of each stage of the TD ADC core 106A; receive calibration updates at the third terminal 111 responsive to the outputs provided to the second terminal 110 and the operations of the calibration circuitry 148; and update delay settings for each stage of the multi-stage architecture 120 responsive to respective calibration updates.

In some examples, the calibration circuitry 148 operates to: receive outputs from each stage of the TD ADC core 106A; and determine calibration adjustments based on the received outputs and the operations of calibration circuitry 148. In some examples, calibration circuitry 148 determines calibration adjustments for a zero-crossing stage (e.g., the first stage 128 in FIG. 1, or the first stage 128A in FIG. 2), an over-range stage (e.g., the over-range stage 136 in FIG. 1, or the over-range stage 136A in FIG. 2), and additional stages (e.g., the additional stages 142) of the TD ADC core 106A.

After calibration, the hybrid ADC 400 operates to: receive an analog input signal at the first terminal 402; and provide a digital code at the second terminal 404 responsive to the analog input signal, the operations of the pipeline stage 405, the TD ADC core 106A, the digital circuitry 442, and the clock generator 422. More specifically, the pipeline stage 405 operates to: receive the analog input signal from the first terminal 402 of the hybrid ADC 400; receive CLK2 from the clock generator 422; convert the analog input signal to a digital result based on CLK2 and the operations of the A2D circuit 406; convert the digital result back to an analog result based on CLK2 and operations of the D2A circuit 414; subtract the analog result from the analog input signal using the subtract circuit 428 to obtain a subtraction result; and apply a gain to the subtraction result using the buffer 436, resulting in a pipeline stage output.

The TD ADC core 106A operates to: receive the pipeline stage output at the first terminal 108; and provide outputs for each stage of the TD ADC core 106A at respective terminals of the set of fourth terminals 112A to 112N of the TD ADC core 106A responsive to the pipeline stage output, respective operations of each stage of the TD ADC core 106A, and a previous calibration for each stage of the TD ADC core 106A.

The digital circuitry 442 operates to: received a clock signal (CLK1) at the first terminal 444; receive the output of the A2D circuit 406 at the second terminal 446; receive the outputs from each stage of the TD ADC core 106A at the set of third terminals 448A to 448N; generate a digital code based on CLK1, the output of the A2D circuit 406 of the pipeline stage 405, and the outputs of the TD ADC core 106A; and provide the digital code to the fourth terminal 450. In some examples, CLK1 and CLK2 are equal.

Compared to a pipeline ADC, the hybrid ADC 400 consumes less power, has a smaller area footprint (lower cost) and faster operation, but has a lower SNR and a lower spurious-free dynamic range (SFDR). Compared to a TD ADC (e.g., the TD ADC 100 in FIG. 1), the hybrid ADC 400 will have a higher SNR and a higher SFDR but has a larger area footprint (higher cost), consumes more power, and is slower. Depending on the particular ADC application, a TD ADC or a hybrid ADC may offer sufficient accuracy at a lower cost and speed compared to a pipeline ADC.

In some examples, an ADC (e.g., the TD ADC 100 in FIG. 1, or the hybrid ADC 400 in FIG. 4) includes a TD ADC core (e.g., the TD ADC core 106 in FIG. 1, or the TD ADC core 106A in FIG. 4). The TD ADC core includes: a first delay-to-digital stage (e.g., the first stage 128A in FIG. 2) having a terminal (e.g., the fifth terminal 216 in FIG. 2); a second delay-to-digital stage (e.g., the over-range stage 136A in FIG. 2) having a terminal (e.g., the fifth terminal 218 in FIG. 2); a third delay-to-digital stage (e.g., the second stage 202A in FIG. 2) having a terminal (e.g., the sixth terminal 214A in FIG. 2); and calibration circuitry (e.g., the calibration circuitry 148 in FIG. 2) coupled to the terminal of the first delay-to-digital stage, the terminal of the second delay-to-digital stage, and the terminal of the third delay-to-digital stage. The calibration circuitry is configured to calibrate the first delay-to-digital stage, the second delay-to-digital stage, and the third delay-to-digital stage based on a zero-crossing calibration and an over-range calibration. The over-range calibration sets a maximum threshold (e.g., +Vref) and a minimum threshold (e.g., –Vref) for the TD ADC relative to a reference voltage.

In some examples, the calibration circuitry is configured to: calibrate the first stage as a zero-crossing stage based on the zero-crossing calibration; and calibrate the second stage as an over-range stage based on the over-range calibration. In some examples, the calibration circuitry is configured to: calibrate the third stage to a first intermediate threshold (e.g., +Vref/2) between zero and the maximum threshold; and calibrate the third stage to a second intermediate threshold (e.g., –Vref/2) between zero and the minimum threshold.

In some examples, the ADC includes a fourth delay-to-digital stage (e.g., the third stage 202B in FIG. 2) coupled to the calibration circuitry. In such examples, the calibration circuitry is configured to: calibrate the fourth delay-to-digital stage to a third intermediate threshold (e.g., +Vref/4) between zero and the first intermediate threshold; and calibrate the fourth delay-to-digital stage to a fourth intermediate threshold (e.g., +3Vref/4) between the first threshold and maximum threshold; calibrate the fourth delay-to-digital stage to a fifth intermediate threshold (e.g., –Vref/4) between zero and the second intermediate threshold; and calibrate the fourth stage to a sixth intermediate threshold (e.g., –3Vref/4) between the second intermediate threshold and the minimum threshold.

In some examples, the ADC comprises a fifth delay-to-digital stage (e.g., the fourth stage 202C in FIG. 2) coupled to the calibration circuitry. In such examples, the calibration circuitry is configured to: calibrate the fifth delay-to-digital stage to a seventh intermediate threshold (e.g., +Vref/8) between zero and the third intermediate threshold; calibrate the fifth delay-to-digital stage to an eighth intermediate threshold (e.g., +3Vref/8) between third intermediate threshold and the first intermediate threshold; calibrate the fifth delay-to-digital stage to a ninth intermediate threshold (e.g., +5Vref/8) between first intermediate threshold and the fourth intermediate threshold; calibrate the fifth delay-to-digital stage to a tenth intermediate threshold (e.g., +7Vref/8) between fourth intermediate threshold and the maximum threshold; calibrate the fifth delay-to-digital stage to an eleventh intermediate threshold (e.g., –Vref/8) between zero and the fifth intermediate threshold; calibrate the fifth delay-to-digital stage to a twelfth intermediate threshold (e.g., –3Vref/8) between the fifth intermediate threshold and the second intermediate threshold; calibrate the fifth delay-to-digital stage to a thirteenth intermediate threshold (e.g., –5Vref/8) between the second intermediate threshold and the fifth intermediate threshold; and calibrate the fifth delay-to-digital stage to a fourteenth intermediate threshold (e.g., –7Vref/8) between the fifth intermediate threshold and minimum threshold.

In some examples, the terminal of the first stage is a first terminal, the first stage has a second terminal (e.g., the first terminal 130A in FIG. 2) and a third terminal (e.g., the second terminal 130B in FIG. 2), the ADC includes V2D circuitry (e.g., the V2D circuitry 114 in FIG. 1) having a first terminal (e.g., the first terminal 116 in FIG. 1), a second terminal (e.g., the second terminal 118A in FIG. 1), and a third terminal (e.g., the third terminal 118B in FIG. 1). The second terminal of the V2D circuitry is coupled to the second terminal of the first delay-to-digital stage. The third terminal of the V2D circuitry is coupled to the third terminal of the first delay-to-digital stage. In some examples, the ADC includes a pipeline stage (e.g., the pipeline stage 405 in FIG. 4) having an output coupled to the first terminal of the V2D circuitry.

In some examples, the ADC includes additional delay-to-digital stages (e.g., the additional stages 142 in FIG. 1, related stages in FIG. 2), wherein the calibration circuitry is configured to interpolate thresholds for each delay-to-digital stage of the additional delay-to-digital stages between two exponential curves. In some examples, each delay-to-digital stage of the additional delay-to-digital stages has a gain greater than one. In some examples, the TD ADC core has a data rate of at least 8Gsps.

Figure 5:
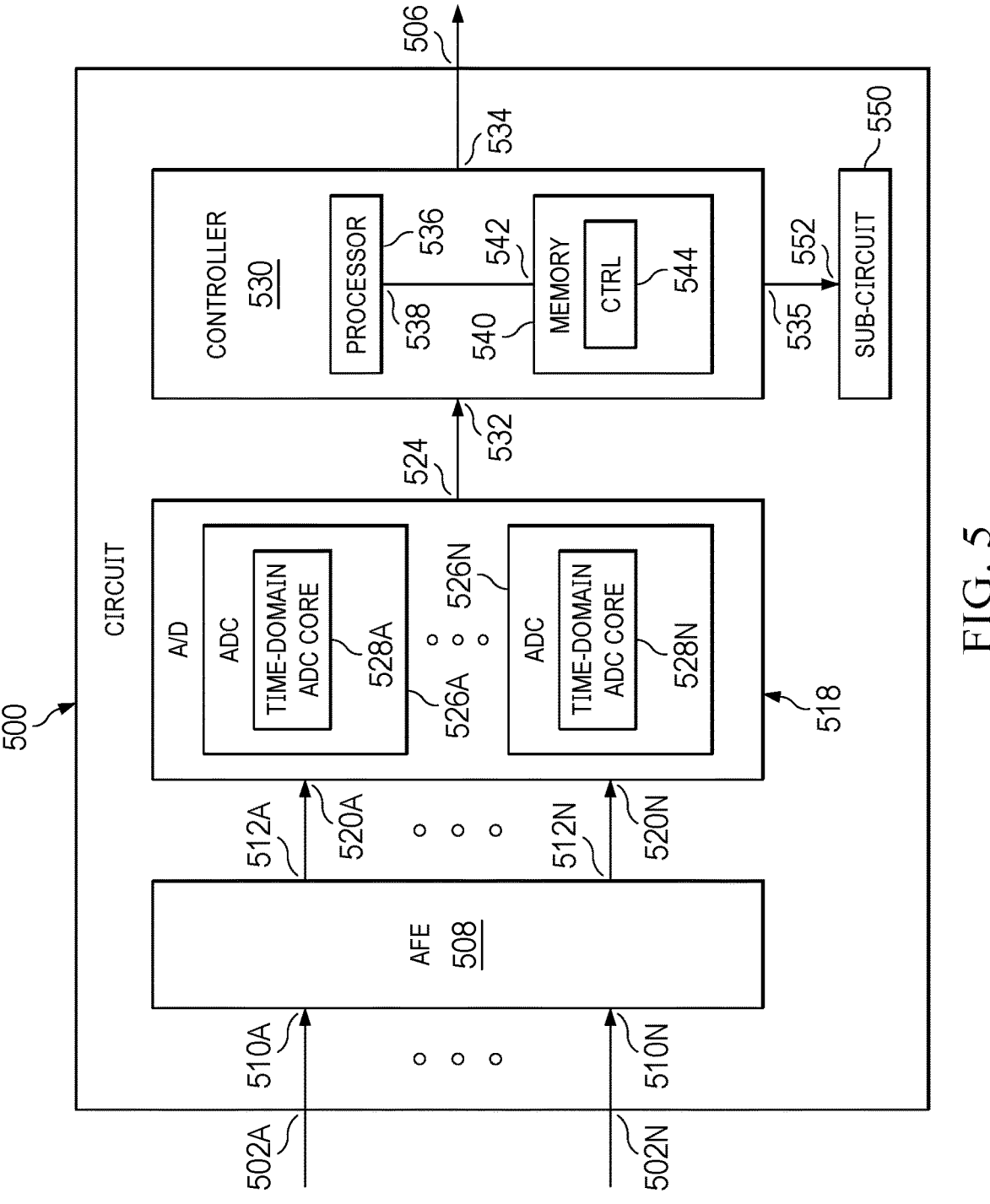
FIG. 5 is a block diagram showing an example circuit with TD ADCs.

FIG. 5 is a block diagram showing an example circuit 500 with TD ADC cores 528A to 528N. Each of the TD ADC cores 528A to 528N is an example of the TD ADC core 106 in FIG. 1, or the TD ADC core 106A in FIG. 4. In some examples, the circuit 500 may be an integrated circuit (IC) or multiple ICs. As shown, the circuit 500 has a set of first terminals 502A to 502N, and a second terminal 506. The circuit 500 includes analog front-end circuitry 508, analog-to-digital (A/D) circuitry 518, a controller 530, and a sub-circuit 550. The AFE circuitry 508 has a set of first terminals 510A to 510N and a second of second terminal 512A to 512N. The A/D circuitry 518 has a set of first terminals 520A to 520N, and a second terminal 524. As shown, the A/D circuitry 518 includes ADCs 526A to 526A. Each of the ADCs 526A to 526N includes a respective TD ADC core of the TD ADC cores 528A to 528N. In some examples, the ADCs 526A to 526N are TD ADCs (e.g., the TD ADC 100 in FIG. 1). In other examples, the ADCs 526A to 526N are hybrid ADCs (e.g., the hybrid ADC 400 in FIG. 4). The controller 530 has a first terminal 532, a second terminal 534, and a third terminal 535. In some examples, the controller 530 includes a processor 536 coupled to a memory 540. The processor 536 has a terminal 538. The memory 540 has a terminal 542 and includes control instructions 544 for execution by the processor 536. The sub-circuit 550 has a terminal 552.

In the example of FIG. 5, the terminals of the set of first terminals 502A to 502N of the circuit 500 are coupled to respective terminals of the set of first terminals 510A to 510N of the AFE circuitry 508. The terminals of the set of second terminals 512A to 512N of the AFE circuitry 508 are coupled to respective terminals of the set of first terminals 520A to 520N of the A/D circuitry 518. The second terminal 524 of the A/D circuitry 518 is coupled to the first terminal 532 of the controller 530. The second terminal 534 of the controller 530 is coupled to the second terminal 506 of the circuit 500. The third terminal 535 of the controller 530 is coupled to the terminal 552 of the sub-circuit 550.

In some examples, the circuit 500 operates to: receive analog input signals at the set of first terminals 502A to 502N. In different examples, the analog input signals at the set of first terminals 502A to 502N may be from a wired cable interface or from antennas that provide analog input signals responsive to ambient wireless signals. The AFE circuitry 508 operates to: receive the analog input signals at the set of first terminals 510A to 510A; filter, amplify, or otherwise condition the analog input signals; and provide conditioned analog signals at the set of second terminals 512A to 512N. In some examples, the AFE circuitry 508 may include an operational amplifier and a filter for each of multiple channels. The operational amplifier of an AFE channel may adjust the gain applied to a received signal. The filter of an AFE channel may remove unwanted frequencies from the received signal.

The A/D circuitry 518 operates to: receive the conditioned analog signals at the set of first terminals 520A to 520N of the A/D circuitry 518; digitize the conditioned analog signals using the ADCs 526A to 526N, resulting in respective digital codes; and provide the digital codes at the second terminal 524 of the A/D circuitry 518. In some examples, the A/D circuitry 518 may be considered part of the AFE circuitry 508.

The controller 530 operates to: receive the digital codes at the first terminal 532 of the controller 530; analyze and/or process the digital codes, individually or in combination, using the processor 536 and the control instructions 544 to determine a control response; provide the control response to the third terminal 535; and/or provide a communication based on the control response to the second terminal 534. The sub-circuit 550 operates to receive the control response at the terminal 552 and adjust control operations performed by the sub-circuit 550 based on the control response. In some examples, the sub-circuit 550 may adjust a voltage, adjust a current, control a switch, control an actuator, control a motor, adjust information on a display, and/or adjust other components responsive to the control response.

In some examples, the circuit 500 is a radar circuit. In such examples, the analog input signals are reflection signals received by antennas coupled to the set of first terminals 502A to 502N after the circuit 500 or another circuit has emitted one or more electromagnetic signals. The analog input signals (e.g., reflection signals) are conditioned by the AFE circuitry 508 and digitized by the A/D circuitry 518. The resulting digital codes are analyzed and/or processed by the controller 530 to determine the position, the velocity, the size and/or other parameters of an object that caused the reflection signals. The determined parameters of the object are used to generate the control response for use by the sub-circuit 550 and/or to generate related communications that are used internally within the circuit 500 or exported to another circuit. The control response and/or related communications may be used to display information, adjust a voltage, adjust a current, control a switch, control an actuator, control a motor, and/or perform other operations responsive to the determined parameters of the object. In other examples, the circuit 500 may be any circuit that uses ADCs, where TD ADCs or hybrid ADCs offer limited accuracy (e.g., an 8-1 0bit output) with the benefits of lower power, lower cost, and higher speeds compared to other ADC topologies.

In some examples, a circuit (e.g., the circuit 500 in FIG. 5) includes: a TD ADC (e.g., the TD ADC 100 in FIG. 1, or one of the ADCs 526A to 526N in FIG. 5). The TD ADC includes: delay-to-digital stages (e.g., the delay-to-digital stages described for the TD ADC core 106 in FIG. 1, the multi-stage architecture 120A in FIG. 2, or the TD ADC core 106A in FIG. 4); and calibration circuitry (e.g., the calibration circuitry 148 in FIGS. 1 and 4) coupled to each delay-to-digital stage of the delay-to-digital stages. The calibration circuitry is configured to calibrate the delay-to-digital stages based on a zero-crossing calibration and an over-range calibration. The over-range calibration sets a maximum threshold (e.g., +Vref) and a minimum threshold (e.g., −Vref) for the TD ADC relative to a reference voltage (e.g., Vref herein).

In some examples, the delay-to-digital stages include a first delay-to-digital stage (e.g., the first stage 128A in FIG. 2), a second delay-to-digital stage (e.g., the over-range stage 136A in FIG. 2), and a third delay-to-digital stage (e.g., the second stage 202A in FIG. 2), and the calibration circuitry is configured to: calibrate the first delay-to-digital stage as a zero-crossing stage; and calibrate the second delay-to-digital stage as an over-range stage.

In some examples, calibration circuitry is configured to: calibrate the third delay-to-digital stage to a first intermediate threshold (e.g., +Vref/2) between zero and the maximum threshold; and calibrate the third delay-to-digital stage to a second intermediate threshold (e.g., −Vref/2) between zero and the negative threshold.

In some examples, the TD ADC includes a fourth delay-to-digital stage (e.g., the third stage 202B in FIG. 2) and a fifth delay-to-digital stage (e.g., the fourth stage 202C in FIG. 2) coupled to the calibration circuitry. In such examples, the calibration circuitry is configured to: calibrate the fourth delay-to-digital stage to a third intermediate threshold (e.g., +Vref/4) between zero and the first intermediate threshold; calibrate the fourth stage to a fourth intermediate threshold (e.g., +3Vref/4) between the first intermediate threshold and the maximum threshold; calibrate the fourth delay-to-digital stage to a fifth intermediate threshold (e.g., −Vref/4) between zero and the second intermediate threshold; and calibrate the fourth delay-to-digital stage to a sixth intermediate threshold (e.g., −3Vref/4) between the second intermediate threshold and the minimum threshold.

In some examples, the calibration circuitry is configured to: calibrate the fifth delay-to-digital stage to a seventh intermediate threshold (e.g., +Vref/8) between zero and the third intermediate threshold; calibrate the fifth delay-to-digital stage to an eighth intermediate threshold (e.g., +3Vref/8) between third intermediate threshold and the first intermediate threshold; calibrate the fifth delay-to-digital stage to a ninth intermediate threshold (e.g., +5Vref/8) between first intermediate threshold and the fourth intermediate threshold; calibrate the fifth delay-to-digital stage to a tenth intermediate threshold (e.g., +7Vref/8) between fourth intermediate threshold and the maximum threshold; calibrate the fifth delay-to-digital stage to an eleventh intermediate threshold (e.g., −Vref/8) between zero and the fifth intermediate threshold; calibrate the fifth delay-to-digital stage to a twelfth threshold (e.g., −3Vref/8) between the fifth intermediate threshold and the second intermediate threshold; calibrate the fifth delay-to-digital stage to a thirteenth intermediate threshold (e.g., −5Vref/8) between the second intermediate threshold and the fifth intermediate threshold; and calibrate the fifth delay-to-digital stage to a fourteenth intermediate threshold (e.g., −7Vref/8) between the fifth intermediate threshold and the minimum threshold.

In some examples, the TD ADC includes V2D circuitry (e.g., the V2D circuitry 114 in FIG. 1) coupled to a first delay-to-digital stage. The V2D circuitry is configured to: receive an analog signal; and provide first and second pulses to the first delay-to-digital stage responsive to the analog signal, the second pulse delayed relative to the first pulse. In some examples, the circuit includes digital circuitry (e.g., the digital circuitry 154 in FIG. 1, or the digital circuitry 442 in FIG. 4) coupled to the delay-to-digital stages and a controller (e.g., the controller 530 in FIG. 5). The digital circuitry is configured to combine an output of each stage of the delay-to-digital stages except the over-range stage to generate a multi-bit digital code. The controller is configured to provide a control response based on the multi-bit digital code.

In some examples, the circuit includes AFE circuitry (e.g., the AFE circuitry 508 in FIG. 5), additional TD ADCs (e.g., others of the ADCs 526A to 526N in FIG. 5), and a controller (e.g., the controller 530 in FIG. 5). In such examples, the AFE circuitry is configured to receive signals from multiple antennas and provide AFE outputs, the TD ADC and the additional TD ADCs are configured to generate digital signals based on the AFE outputs, and the controller is configured to perform a control response based on the digital signals. In some examples, the control response is a radar operation and the TD ADC and the additional TD ADCs operate at 8 Gbps or higher.

Figure 6:
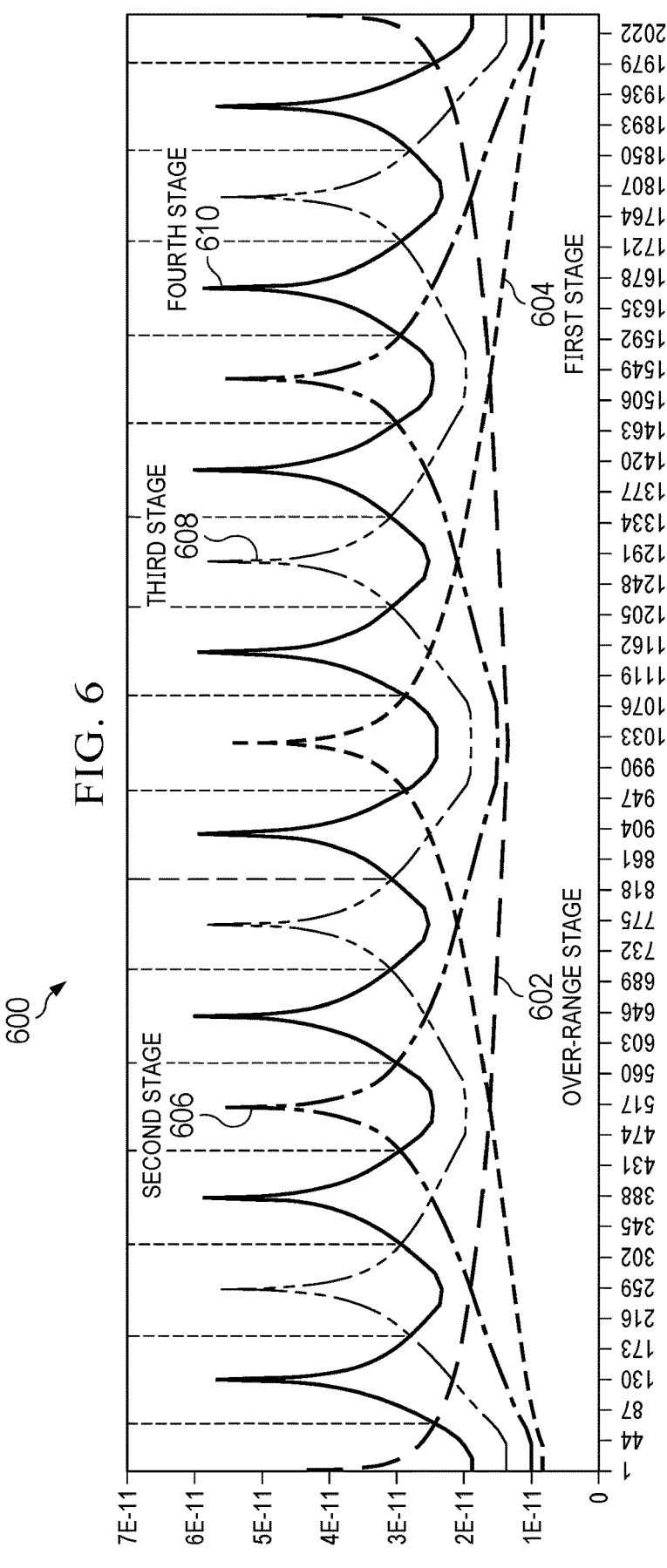
FIG. 6 is a diagram showing example calibration curves and related thresholds for a TD ADC core.

FIG. 6 is a diagram 600 showing example calibration curves and related thresholds for a TD ADC core (e.g., the TD ADC core 106 in FIG. 1, or the TD ADC core 106A in FIG. 4). In the diagram 600, an over-range stage calibration curve 602, a zero-crossing stage calibration curve 604, a second stage calibration curve 606, a third stage calibration curve 608, and a fourth stage calibration curve 610 are represented. The over-range stage calibration curve 602 includes two thresholds at +/−Vref (not shown). The zero-crossing stage calibration curve 604 includes a threshold at 0. The second stage calibration curve 606 includes two thresholds $$+/-\frac{Vref}{2}.$$

The third stage calibration curve 608 includes four thresholds $$at +/-\frac{Vref}{4}$$

and $$+/-3\times\frac{Vref}{4}.$$

The fourth stage calibration curve 610 includes eight thresholds $$+/-\frac{Vref}{8},$$

$$+/-3\times\frac{Vref}{8},$$

$$+/-5\times\frac{Vref}{8},$$

and $$+/-7\times\frac{Vref}{8}.$$

The thresholds described herein correspond to comparator thresholds.

With the over-range stage calibration curve 602, the zero-crossing stage calibration curve 604, and other stage calibration curves (between the over-range stage calibration curve 602 and the zero-crossing stage calibration curve 604), the spacing of thresholds is improved relative to TD ADCs without an over-range stage and related over-range calibration. In some examples, the SQNR for the TD ADCs described herein is above 45 dB (an improvement of around 10 dB over previous TD ADCs without the over-range stage).

Figure 7A:
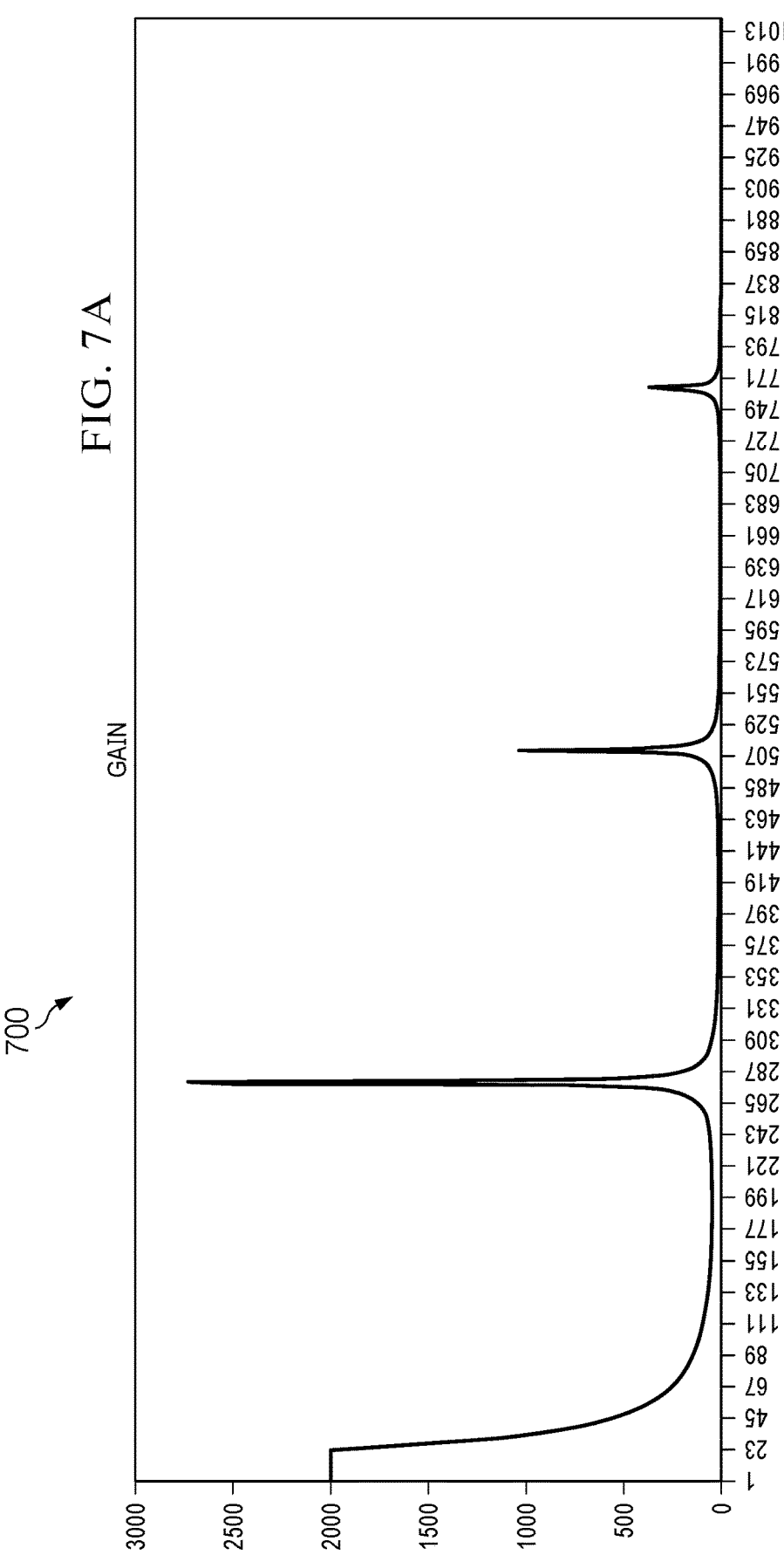
FIGS. 7A and 7B are graphs showing an example gain profile of a TD ADC core with and without an over-range stage.
Figure 7B:
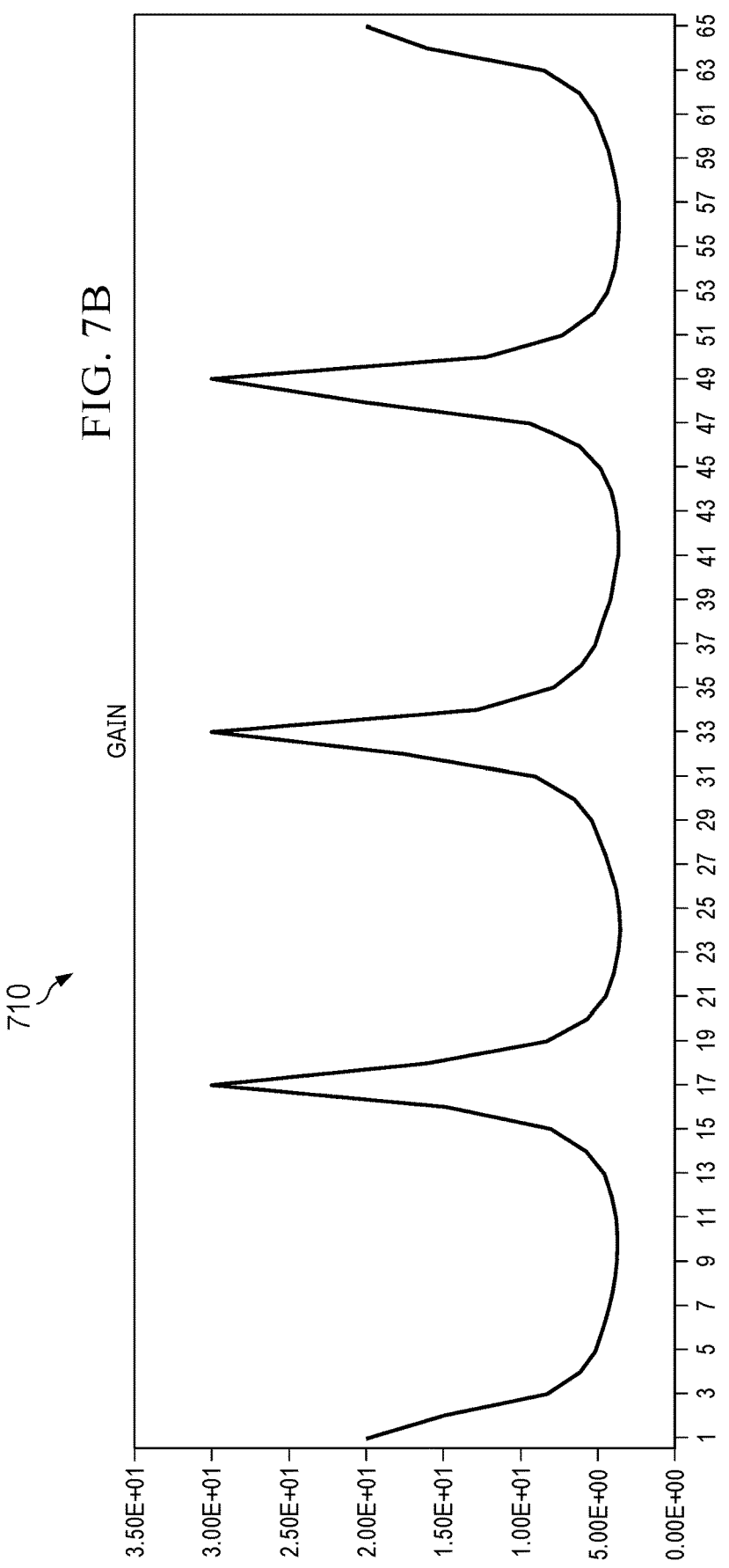

FIGS. 7A and 7B are graphs 700 and 710 showing example gain profiles of a TD ADC core with and without an over-range stage. In graph 700 of FIG. 7A, the gain profile from a third stage output for a TD ADC core without an over-range stage is represented. For graph 700, an input that ranges between 0 to an input voltage (Vin) is assumed. As shown, the gain is approximately unity except around comparator thresholds.

In graph 710 of FIG. 7B, the gain profile from a third stage output for a TD ADC core with an over-range stage is represented. For graph 710, an input that ranges between 0 to an input voltage (Vin) is assumed. As shown, the gain stays above 3 even after a third stage, which relaxes noise management issues for later stages of a TD ADC core. A TD ADC with an over-range stage has an improved gain profile, a relaxed noise management issues for later delay-to-digital stages and is smaller (lower cost) relative to other TD ADC topologies. For example, the improved gain profile for later delay-to-digital stages means the transistors used for the comparator 302, the OR gate 312, and the AND gate 320 of each of these later delay-to-digital stages can be smaller compared to other TD ADC topologies, resulting in a reduced size and cost.

Figure 8:
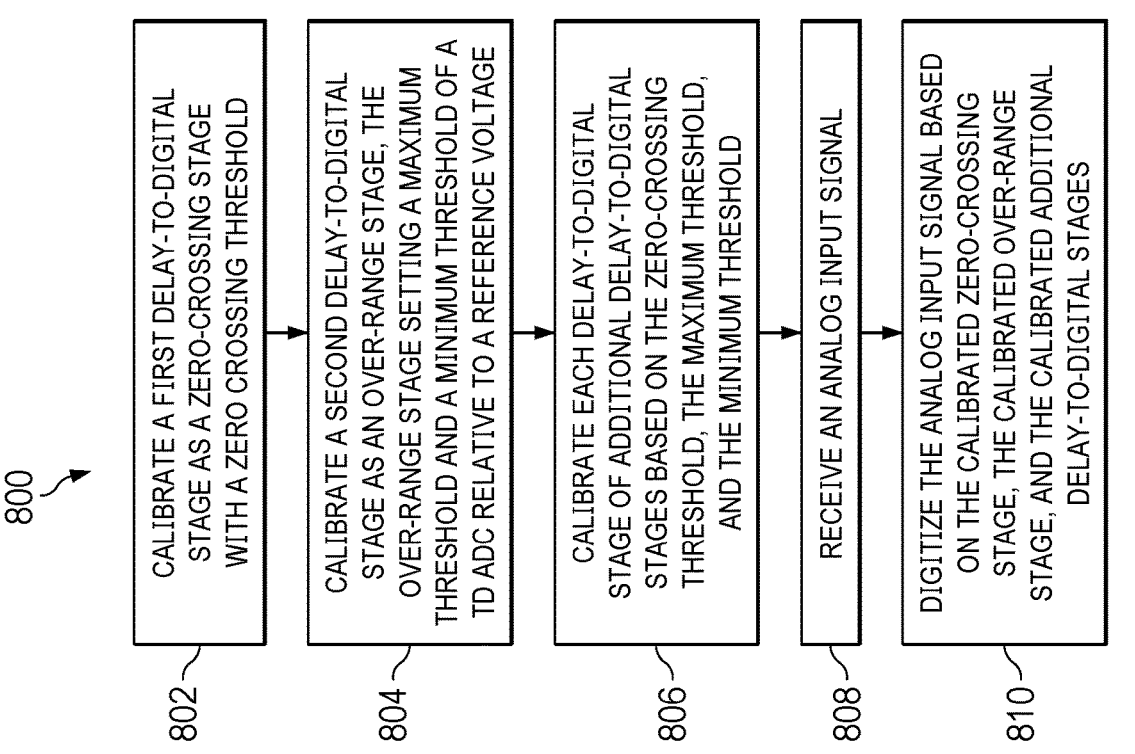
FIG. 8 is a flowchart showing an example method.

FIG. 8 is a flowchart showing an example method 800. The method 800 is performed, for example, by a TD ADC (e.g., the TD ADC 100 in FIG. 1, or one of the ADCs 526A to 526N) and related calibration circuitry (e.g., the calibration circuitry 148 in FIGS. 1 and 4) once, periodically, upon start-up, or in response to recalibration trigger. As shown, the method 800 includes calibrating a first delay-to-digital stage as a zero-crossing stage with a zero-crossing threshold at block 802. At block 804, a second delay-to-digital stage is calibrated as an over-range stage. The over-range stage sets a maximum threshold and a minimum threshold for a TD ADC relative to reference voltage (e.g., Vref herein). At block 806, each delay-to-digital stage of additional delay-to-digital stages is calibrated based on the zero-crossing threshold, the maximum threshold, and the minimum threshold. At block 808, analog input signal is received. At block 810, the analog input signal is digitized based on the calibrated zero-crossing stage, the calibrated over-range stage, and the calibrated additional delay-to-digital stages.

In some examples, digitizing the analog input signal at block 810 includes generating a multi-bit digital signal by combining an output of the zero-crossing stage and outputs of the additional delay-to-digital stages, but not an output of the over-range stage. In some examples, digitizing the analog input signal at block 810 includes converting a voltage of the analog input signal to pulses offset from each other.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

The invention claimed is:

1. A analog-to-digital converter (ADC) comprising:
   a time-domain ADC core that includes:
      a first delay-to-digital stage having a terminal;
      a second delay-to-digital stage having a terminal;
      a third delay-to-digital stage having a terminal; and
      calibration circuitry coupled to the terminal of the first delay-to-digital stage, the terminal of the second delay-to-digital stage, and the terminal of the third delay-to-digital stage of stages, the calibration circuitry is configured to calibrate the first delay-to-digital stage, the second delay-to-digital stage, and the third delay-to-digital stage based on a zero-crossing calibration and an over-range calibration, the over-range calibration setting a maximum threshold and a minimum threshold for the time-domain ADC core relative to a reference voltage.

2. The ADC of claim 1, wherein the calibration circuitry is configured to:

calibrate the first delay-to-digital stage as a zero-crossing stage based on the zero-crossing calibration; and calibrate the second delay-to-digital stage as an over-range stage based on the over-range calibration.

3. The ADC of claim 2, wherein the calibration circuitry is configured to:

calibrate the third delay-to-digital stage to a first intermediate threshold between zero and the maximum threshold; and calibrate the third delay-to-digital stage to a second intermediate threshold between zero and the minimum threshold.

4. The ADC of claim 1, wherein the terminal of the first delay-to-digital stage is a first terminal, the first delay-to-digital stage has a second terminal and a third terminal, the time-domain ADC core further comprises voltage-to-delay (V2D) circuitry having a first terminal, a second terminal, and a third terminal, the second terminal of the V2D circuitry coupled to the second terminal of the first delay-to-digital stage, and the third terminal of the V2D circuitry coupled to the third terminal of the first delay-to-digital stage.

5. The ADC of claim 4, further comprising a pipeline stage having an output coupled to the first terminal of the V2D circuitry.

6. The ADC of claim 1, wherein the time-domain ADC core includes additional delay-to-digital stages, wherein the calibration circuitry is configured to interpolate thresholds for each of the additional delay-to-digital stages between two exponential curves.

7. The ADC of claim 6, wherein each delay-to-digital stage of the additional delay-to-digital stages has a gain greater than one.

8. The ADC of claim 1, wherein the time-domain ADC core has a data rate of at least 8 Gsps.

9. The ADC of claim 3, wherein the time-domain ADC core includes a fourth delay-to-digital stage coupled to the calibration circuitry, and the calibration circuitry is configured to:

calibrate the fourth delay-to-digital stage to a third intermediate threshold between zero and the first intermediate threshold;

calibrate the fourth delay-to-digital stage to a fourth intermediate threshold between the first intermediate threshold and the maximum threshold;

calibrate the fourth delay-to-digital stage to a fifth intermediate threshold between zero and the second intermediate threshold; and calibrate the fourth delay-to-digital stage to a sixth intermediate threshold between the second intermediate threshold and the minimum threshold.

10. The ADC of claim 9, wherein the time-domain ADC core includes a fifth delay-to-digital stage coupled to the calibration circuitry, and the calibration circuitry is configured to:

calibrate the fifth delay-to-digital stage to a seventh intermediate threshold between zero and the third intermediate threshold;

calibrate the fifth delay-to-digital stage to an eighth intermediate threshold between third intermediate threshold and the first intermediate threshold;

calibrate the fifth delay-to-digital stage to a ninth intermediate threshold between first intermediate threshold and the fourth intermediate threshold;

calibrate the fifth delay-to-digital stage to a tenth intermediate threshold between fourth intermediate threshold and the maximum threshold;

calibrate the fifth delay-to-digital stage to an eleventh intermediate threshold between zero and the fifth intermediate threshold;

calibrate the fifth delay-to-digital stage to a twelfth intermediate threshold between the fifth intermediate threshold and the second intermediate threshold;

calibrate the fifth delay-to-digital stage to a thirteenth intermediate threshold between the second intermediate threshold and the fifth intermediate threshold; and calibrate the fifth delay-to-digital stage to a fourteenth intermediate threshold between the fifth intermediate threshold and the minimum threshold.

11. A circuit comprising:

a time-domain analog-to-digital converter (ADC) including delay-to-digital stages; and calibration circuitry coupled to each delay-to-digital stage of the delay-to-digital stages, the calibration circuitry configured to calibrate the delay-to-digital stages based on a zero-crossing calibration and an over-range calibration, the over-range calibration setting a maximum threshold and a minimum threshold for the time-domain ADC relative to a reference voltage.

12. The circuit of claim 11, wherein the delay-to-digital stages include a first delay-to-digital stage, a second delay-to-digital stage, and a third delay-to-digital stage, and the calibration circuitry is configured to:

calibrate the first delay-to-digital stage as a zero-crossing stage; and calibrate the second delay-to-digital stage as an over-range stage.

13. The circuit of claim 12, the calibration circuitry is configured to:

calibrate the third delay-to-digital stage to a first intermediate threshold between zero and the maximum threshold; and calibrate the third delay-to-digital stage to a second intermediate threshold between zero and the minimum threshold.

14. The circuit of claim 13, wherein time-domain ADC comprises fourth and fifth delay-to-digital stages coupled to the calibration circuitry, and the calibration circuitry is configured to:

calibrate the fourth delay-to-digital stage to a third intermediate threshold between zero and the first intermediate threshold; and calibrate the fourth delay-to-digital stage to a fourth intermediate threshold between the first intermediate threshold and the maximum threshold;

calibrate the fourth delay-to-digital stage to a fifth intermediate threshold between zero and the second intermediate threshold;

calibrate the fourth delay-to-digital stage to a sixth intermediate threshold between the second intermediate threshold and the minimum threshold;

calibrate the fifth delay-to-digital stage to a seventh intermediate threshold between zero and the third intermediate threshold;

calibrate the fifth delay-to-digital stage to an eighth intermediate threshold between third intermediate threshold and the first intermediate threshold;

calibrate the fifth delay-to-digital stage to a ninth intermediate threshold between first intermediate threshold and the fourth intermediate threshold;

calibrate the fifth delay-to-digital stage to a tenth intermediate threshold between fourth intermediate threshold and the maximum threshold;

calibrate the fifth delay-to-digital stage to an eleventh intermediate threshold between zero and the fifth intermediate threshold;

calibrate the fifth delay-to-digital stage to a twelfth intermediate threshold between the fifth intermediate threshold and the second intermediate threshold;

calibrate the fifth delay-to-digital stage to a thirteenth intermediate threshold between the second intermediate threshold and the fifth intermediate threshold; and calibrate the fifth delay-to-digital stage to a fourteenth intermediate threshold between the fifth intermediate threshold and the minimum threshold.

15. The circuit of claim 12, wherein the time-domain ADC includes voltage-to-delay (V2D) circuitry coupled to the first delay-to-digital stage, the V2D circuitry configured to:

receive an analog signal; and provide first and second pulses to the first delay-to-digital stage responsive to the analog signal, the second pulse delayed relative to the first pulse.

16. The circuit of claim 12, further comprising digital circuitry and a controller, the digital circuitry coupled to at least some of the delay-to-digital stages, the digital circuitry is configured to combine an output of each delay-to-digital stage of the delay-to-digital stages except the over-range stage to generate a multi-bit digital code, and the controller is configured to perform a control response based on the multi-bit digital code.

17. The circuit of claim 12, wherein the circuit further comprising analog front-end (AFE) circuitry, additional time-domain ADCs, and a controller, the AFE circuitry configured to receive signals from multiple antennas and provide AFE outputs, the time-domain ADC and the additional time-domain ADCs are configured to generate digital signals based on the AFE outputs, and the controller is configured to perform a control response based on the digital signals.

18. The circuit of claim 17, wherein the control response is a radar operation and the time-domain ADC and the additional time-domain ADCs operate at 8 Gbps or higher.

19. A method comprising:

calibrating a first delay-to-digital stage as a zero-crossing stage with a zero-crossing threshold;

calibrating a second delay-to-digital stage as an over-range stage, the over-range stage setting a maximum threshold and a minimum threshold for a time-domain analog-to-digital converter (ADC) relative to a reference voltage;

calibrating each delay-to-digital stage of additional delay-to-digital stages based on the zero-crossing threshold, the maximum threshold, and the minimum threshold;

receiving an analog input signal; and digitizing the analog input signal based on the calibrated zero-crossing stage, the calibrated over-range stage, and calibrated additional delay-to-digital stages.

20. The method of claim 19, wherein digitizing the analog input signal includes generating a multi-bit digital signal by combining an output of the zero-crossing stage and outputs of the additional delay-to-digital stages, but not an output of the over-range stage.

21. The method of claim 19, wherein digitizing the analog input signal includes converting a voltage of the analog input signal to pulses offset from each other.

* * * * *